(12) United States Patent
Abesingha et al.

(10) Patent No.: US 10,734,893 B1
(45) Date of Patent: Aug. 4, 2020

(54) DRIVING CIRCUIT FOR SWITCHES USED IN A CHARGE PUMP

(71) Applicant: pSemi Corporation, San Diego, CA (US)

(72) Inventors: Buddhika Abesingha, Escondido, CA (US); Arezu Bagheri, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/402,874

(22) Filed: May 3, 2019

(51) Int. Cl.
  *H02M 3/07* (2006.01)
  *H03K 17/687* (2006.01)
  *H02M 1/08* (2006.01)

(52) U.S. Cl.
  CPC .............. *H02M 3/07* (2013.01); *H02M 1/08* (2013.01); *H03K 17/687* (2013.01)

(58) Field of Classification Search
  None
  See application file for complete search history.

(56) References Cited

U.S. PATENT DOCUMENTS

| | | | | |
|---|---|---|---|---|
| 3,702,943 | A * | 11/1972 | Heuner | H03K 5/023 327/81 |
| 10,348,191 | B2 * | 7/2019 | Giuliano | H01L 25/16 |
| 2008/0186081 | A1 * | 8/2008 | Yamahira | H02M 3/073 327/536 |
| 2013/0064014 | A1 * | 3/2013 | Tailliet | G11C 16/0425 365/185.18 |
| 2015/0098160 | A1 * | 4/2015 | Gao | H03K 17/0822 361/86 |
| 2016/0197552 | A1 * | 7/2016 | Giuliano | H02M 3/07 363/60 |
| 2017/0244318 | A1 * | 8/2017 | Giuliano | H02M 3/07 |
| 2017/0285679 | A1 * | 10/2017 | Szczeszynski | H02M 3/07 |
| 2019/0089258 | A1 * | 3/2019 | Giuliano | H02M 3/073 |
| 2019/0115830 | A1 * | 4/2019 | Giuliano | H02M 1/4225 |

* cited by examiner

*Primary Examiner* — Cassandra F Cox
(74) *Attorney, Agent, or Firm* — Berkeley Law & Technology Group, LLP

(57) ABSTRACT

A power converter includes a charge pump in which transistors transition between conducting and non-conducting states thereby causing said pump capacitors to be interconnected in different arrangements at different times. Among the transistors is one that transitions into a conducting state when a source and gate of that transistor are at equal potentials.

19 Claims, 5 Drawing Sheets

DRIVING CIRCUIT FOR SWITCHES USED IN A CHARGE PUMP

FIELD OF INVENTION

The invention relates to power conversion, and in particular, to charge pumps.

BACKGROUND

In a typical charge pump, a set of switches in a switching-network interconnects pump-capacitors to form different capacitor networks at different times. By transitioning between different capacitor networks, it is possible to transform an input voltage into an output voltage. A network of this type is often referred to as a "switched-capacitor network."

The switches are typically implemented by field-effect transistors that can be made to transition between conducting and non-conducting states through the enhancement and depletion of an inversion layer between two similarly doped semiconducting regions. To cause this transition, it is usual to cause an electric field to be present in an oppositely-doped semiconducting region between the two similarly-doped semiconducting regions. The two similarly-doped regions are often called a "source" and "drain." The oppositely-doped region is often called a "channel."

To control the electric field, it is usual to place a conducting metal plate on an oxide layer that covers the channel region. This plate is often called a "gate terminal." By depositing and withdrawing charge on this gate terminal, it is possible to control the electric field within the channel region. A circuit that is responsible for depositing and withdrawing this charge quickly and at particular times is a "driver."

In general, when no voltage is applied, there will be no inversion layer to connect the source and the drain. As a result, a charge carrier faces a significant obstacle in trying to traverse the channel. This means that there is no significant conduction between the source and drain. When this happens, the transistor is conducting. In this state, the switch is said to be "open" or "off."

To permit conduction, it is necessary to apply a voltage on the gate terminal. This voltage creates an electric field that drives away majority carriers, thus depopulating a layer near the gate terminal. Charge carriers from the source can then enter this depopulated layer and reach the drain from the source. Since this layer is now populated with what would be minority carriers from the gate's point of view, a population inversion, the layer is referred to herein as an "inversion layer." When this happens, the transistor conducts. In this state, the switch is said to be "closed" or "on."

In a transistor as described above, the switch is open by default. Such a transistor is referred to as "normally off." In such cases, to close the switch, one needs to apply a voltage.

However, there also exist transistors in which this behavior is reversed. In these transistors, the switch is closed by default. Such a transistor is said to be "normally on." To open the switch, one needs to apply a voltage. Such a transistor requires a different type of drive circuit.

SUMMARY

The invention features a charge pump for power conversion. The charge pump includes switches that interconnect capacitors, with at least one of the switches implemented by transistors that are closed or ON by default and that must be opened or turned off by application of a suitable gate voltage.

In one aspect, the invention features a power converter in which a charge pump includes a switching network for interconnecting pump capacitors. A controller causes the transistors that implement the switching network's switches to transition between conducting and non-conducting states thereby causing the pump capacitors to be interconnected in different arrangements at different times. Among these transistors is a first transistor that transitions into a conducting state when its source and gate are at equal potentials.

In some embodiments, the switching network includes transistors disposed to selectively ground cathodes of the pump capacitors and transistors disposed to interconnect anodes of said pump capacitors. The former define grounded switches and the latter define floating switches.

Some embodiments include a gate driver whose output connects to a gate of the first transistor with the first transistor's source being connected to the gate driver's supply.

Also among the embodiments are those in which the first transistor's source potential floats relative to ground during operation of the charge pump. This means that the source potential varies with time relative to a ground potential during operation of the charge pump.

In some embodiments, a gate driver connected to a gate of the first transistor causes the first transistor to cease conducting. It does so by applying a voltage to its gate. The value of this voltage varies with time as the power converter transitions between different arrangements of interconnected pump capacitors during its operation.

Also among the embodiments are power converters that have two dies made from different semiconductors. The first die includes the first transistor and the second die includes a drive circuit for driving the first transistor. A communication link exists between the first and second dies.

Among these multi-die embodiments are those in which the first die is silicon-free and the second die includes silicon. Also among these embodiments are those in which the first die is formed from a substrate other than silicon and those in which the second die is formed from a silicon substrate.

Also among these multi-die embodiments are those in which the transistors of the switching network are on a first die and the controller, gate drivers, and lever shifters for operating the transistors are all on a second die. Such embodiments can feature dies made from different semiconductors. In some of these cases, one die is a silicon die and the other is a silicon-free die. In other cases, one die is made from a silicon substrate and the other die is made from a substrate other than silicon.

Also among these multi-die embodiments are those in which the first die includes a transistor that has the property of being able to conduct between its source and drain even when no voltage is applied to its gate and the property of inhibiting conduction between its source and its drain upon application of a suitable voltage at its gate.

Of course, not all embodiments require two dies. The subject matter described and claimed herein can also be implemented on a single die. In a particular single-die embodiment, the die includes both the first transistor and a first drive circuit for driving the first transistor.

Or it can be implemented on three dies. Some embodiments can be implemented on four, five, or even six dies. In fact, the subject matter described herein can be implemented on any number of dies.

In other embodiments, a driver includes a voltage governor that causes the driver's output voltage to vary in response to variations in the first transistor's source voltage as measured relative to ground. Among these are drivers in which a voltage across a bias capacitor controls an offset between the first transistor's gate and source voltages when the first transistor is to be made to stop conducting. Among these embodiments are those in which the governor includes stable DC-voltage source with low series impedance connected in parallel across the bias capacitor. In some embodiments, a Zener diode implements such a source with its breakdown voltage functioning as the required stable DC voltage.

Also among these embodiments is one in which the governor includes a shunt device that connects to the bias capacitor. An op-amp connected to the shunt device's gate controls how much current passes through it and does so in such a way as to maintain sufficient voltage on the bias capacitor. These embodiments include something to control the shunt device, such as a shunt regulator. Among the varieties of a shunt regulator is one in which a differential amplifier provides a control signal that regulates the current through the shunt device. The differential amplifier includes first and second inputs that define a voltage difference that varies in response to variations in voltage across the bias capacitor.

Alternatively, the shunt device and the differential amplifier can be replaced with a source follower. An example would be one in which biasing circuitry controls a shunt device connected to the bias capacitor based on variations in the source voltage of the first transistor.

In other embodiments, a driver for driving the first transistor includes a switched-capacitor circuit in which a voltage across a first capacitor governs a voltage difference between a source and gate of the first transistor and a second capacitor replenishes charge on the first capacitor as needed to maintain a desired voltage. The switched-capacitor circuit also has switches that connect and disconnect the first and second capacitors from each other.

In other embodiments, a driver for driving the first transistor includes a switched-capacitor circuit in which a voltage across a first capacitor governs a voltage difference between a source and gate of the first transistor and a second capacitor replenishes charge on the first capacitor as needed to maintain a desired voltage. In this embodiment, the switches are configured to connect and disconnect the first and second capacitors from each other and to connect and to also disconnect the second capacitor from an external voltage source.

In other embodiments, the charge pump includes an internal node that is maintained at an intermediate voltage. These embodiments include a driver for driving the first transistor using a switched-capacitor circuit that includes first and second capacitors. A voltage across the first capacitor governs a voltage difference between a source and gate of the first transistor and the second capacitor connects to the node to obtain charge for use in replenishing the first capacitor as needed to maintain a desired voltage across the first capacitor.

In other embodiments, the charge pump includes an internal node that is at an intermediate voltage. These embodiments include a driver for driving the first transistor using a switched-capacitor circuit. The switched-capacitor circuit includes first, second, and third capacitors. A voltage across the first capacitor governs a voltage difference between a source and gate of the first transistor, the second capacitor connects to the node to obtain charge for use in replenishing the first capacitor as needed to maintain a desired voltage across the third capacitor, and the third capacitor replenishes charge on the first capacitor.

Embodiments further include those in which an inductance connects to the charge pump such that a quantity of charge on at least one of the pump capacitors changes when charge passes through the inductance and those in which an LC circuit connects to the charge pump.

In other embodiments, the different arrangements interconnect the pump capacitors so as to form at least two charge-transfer paths that exist at different times during operation of said switching network. In such embodiments, the charge-transfer paths do not coexist at the same time. In a typical case, one charge-transfer path will come into existence for some period and will then cease to exist. This is followed by a brief dead time during which no charge-transfer path exists. After the lapse of this dead time, the switching network then brings a new charge-transfer path into existence.

The accompanying description and background describe certain aspects of device physics that may be useful in understanding the subject matter recited in the claims. However, it is important to remember that the subject matter of the invention as claimed exists independently and apart from the description of the underlying device physics and is in no way dependent on the veracity of that description. This is a natural consequence of the basic epistemological fact that all such descriptions are based only on experimentally-verifiable models of an underlying physical reality, that therefore all explanations based on physics are necessarily subject to error, and that the history of scientific progress is essentially no more than a history of correcting such errors.

These and other features of the invention will be apparent from the following detailed description and the accompanying drawings, in which:

DETAILED DESCRIPTION

Figure 1:
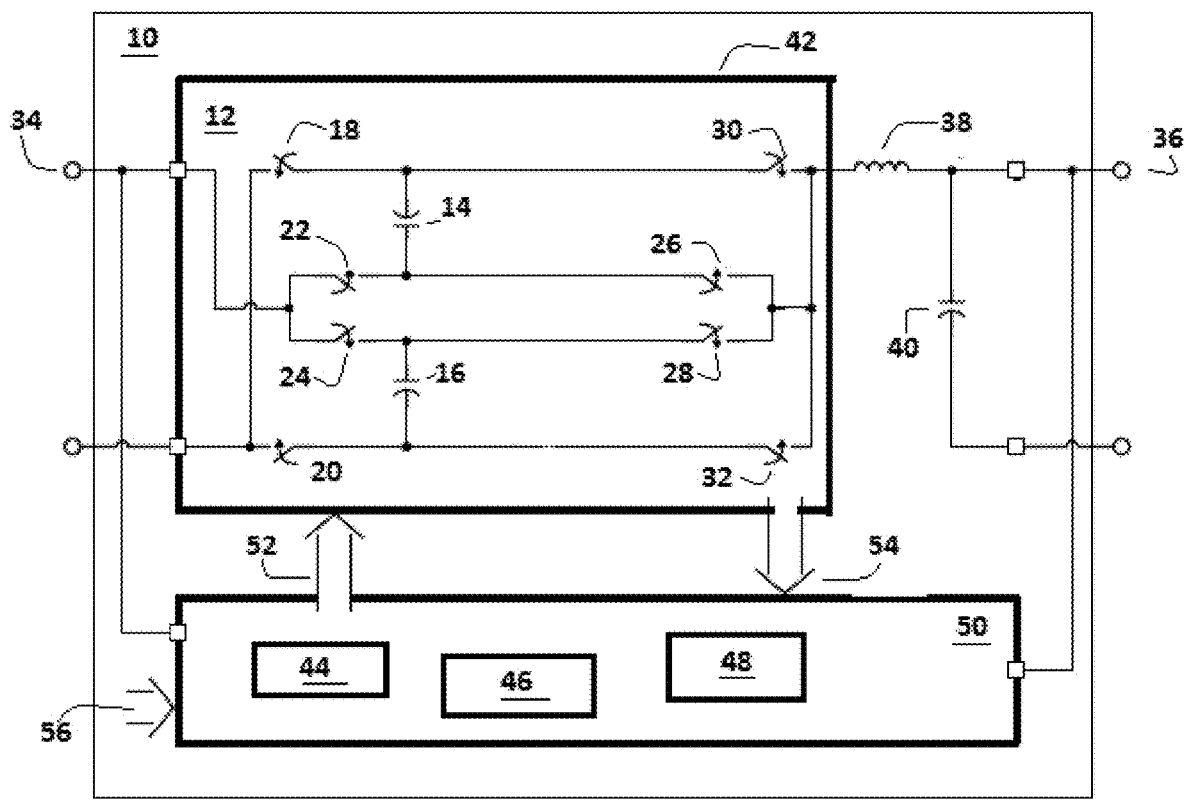
FIG. 1 shows a 2:1 power converter that uses interconnected capacitors to carry out a voltage transformation.

FIG. 1 shows a power converter 10 that includes a charge pump 12. The charge pump 12 includes first and second pump capacitors 14, 16 interconnected by first and second grounded switches 18, 20 and first through sixth floating switches 22, 24, 26, 28, 30, 32.

Further examples of power converters of the type shown in FIG. 1 are described in detail in U.S. Pat. Nos. 8,860,396, 8,743,553, 8,723,491, 8,503,203, 8,693,224, 8,724,353, 8,619,445, 9,203,299, 9,742,266, 9,041,459, U.S. Publication No. 2017/0085172, U.S. Pat. Nos. 9,887,622, 9,882,471, PCT Publication No. WO2017161368, PCT Publication No. WO2017/091696, PCT Publication No. WO2017/143044, PCT Publication No. WO2017/160821, PCT Publication No. WO2017/156532, PCT Publication No. WO2017/196826, and U.S. Publication No. 2017/0244318, the contents of which are all incorporated herein by reference.

The charge pump 12 includes additional circuitry that is used for pre-charging the capacitors so that the charge pump can start operating. This circuitry has been omitted for clarity.

During operation, the first and second grounded switches 18, 20 and the first through sixth floating switches 22, 24, 26, 28, 30, 32 are choreographed to transition between switching arrangements. Each switching arrangement is defined by a set of switches that are open and another set of switches that are closed. Each switching arrangement exists for a period of time.

During the course of its operation, the charge pump 12 transitions from a first switching arrangement to a next switching arrangement and eventually back to the first switching arrangement. These transitions from the first switching arrangement, through one or more next switching arrangements, and then back to the first switching arrangement, will repeat indefinitely during the charge pump's operation.

The illustrated converter 10 has first and second ports 34, 36 that are at first and second voltages. In the illustrated power converter 10, the ratio between these voltages is 2:1. However, the illustrated architecture is readily expandable to have an N:1 voltage ratio.

Two of the switching arrangements of the charge pump 12 form two different charge-transfer paths within the charge pump 12. However, the methods and systems described herein can be used with charge pumps having arrangements that form more than two separate and distinct charge-transfer paths during operation as well as arrangements that rely on only a single charge-transfer path through the charge pump.

When charged, each pump capacitor 14, 16 stores energy within an electric field created by the charge stored therein. Operation of the charge pump 12 involves moving the energy associated with this field between pump capacitors 14, 16. Since this energy arises from charge, one way to do this would be to move charge from one capacitor to another, for example by simply connecting them together. This would discharge one capacitor while charging the other. The movement of charge would thus result in movement of energy from one capacitor to the other.

However, this manner of moving energy between capacitors results in loss. To reduce such loss, it is useful to take the energy from one capacitor and temporarily store it in a magnetic field. This stored magnetic energy can then be converted into electrical energy stored in another capacitor. The net effect of this is to achieve the movement of electrical energy from one capacitor to another while avoiding the loss associated with charge redistribution between capacitors.

This form of energy transfer can be carried out by strategically placing an inductance so that charge transferred into and out of at least one capacitor is associated with current through the inductor. The inductance uses this current to support a magnetic field that stores the associated energy. This energy can then be recovered from the magnetic field during a later stage in the operation of the charge pump 12 and converted into electrical energy stored in a capacitor. In effect, the inductance creates a form of "magnetic flywheel" that recovers and recycles the energy that would otherwise have been lost during charge redistribution.

The illustrated power converter 10 thus includes an inductor 38 through which this charge can be made to pass through operation of the third through sixth floating switches 26, 28, 30, 32. Charge passing through the inductor 38 collects at a terminal capacitor 40 that is maintained at a relatively constant voltage.

The location of the inductor 38 is selected to ensure that charge redistribution between pump capacitors 14, 16 will cause current through the inductor 38. Thus will allow the inductor 38 to capture energy associated with that charge redistribution and to then release it at a later time. In addition, the inductor 38 must have an inductance selected to avoid causing a resonance condition that can be stimulated by the operation of the third through sixth floating switches 26, 28, 30, 32.

The particular example of a power converter that is described herein features a first die 42 and a second die 50. However, this is only by way of example. A power converter that incorporates the principles described herein can be implemented on a single die. Alternatively, a power converter as described herein can be implemented in three or more dies.

The first die 42 carries the switches 18-32. The second die 50 carries other circuits for operating the charge pump 12. Examples of such circuits include driving circuits 44, level shifters 46, and a controller 48. During operation of the power converter 10, the first and second dies 42, 50 exchange input and output signals 52, 54. The second die 50 also includes an external interface 56 for exchanging digital signals with other devices.

A variety of transistors can be used to implement the switches 18-32. Among these are field-effect transistors and junction transistors. Examples of junction transistors include bipolar junction transistors. Examples of field-effect transistors include heterojunction transistors and homojunction transistors. Examples of homojunction transistors are MOSFETS and JFETs. Examples of heterojunction transistors include high electron-mobility transistors.

A variety of materials can be used as the semiconductor. In some embodiments, the semiconductor is an elemental semiconductor, such as silicon or germanium. In other embodiments, the semiconductor is a compound semiconductor. Examples include silicon carbide, indium phosphate, gallium arsenide, gallium nitride, aluminum gallium nitride, and silicon germanium.

Among the transistors that are suitable for implementing one or more of the switches 18-32 is one that conducts between its source and drain unless a voltage is applied to its gate to prevent it from doing so. Examples of suitable transistors that are normally-conducting include those in which a junction exists between two dissimilar materials and not just two differently-doped variants of the same material.

In some of these embodiments, the die has two regions made of two dissimilar materials that abut against each other to form a junction. By suitably arranging these two regions of dissimilar materials, it is possible to form a very thin layer that is flooded with highly mobile electrons in the conduction band. These high-mobility electrons flow as freely as if they were a gas. As such, they form the basis of conduction between a source and drain of a transistor, provided no voltage is applied to a gate terminal thereof to inhibit such conduction.

In one embodiment, one of the dissimilar materials is a semiconductor crystal in which the nodes of the semiconductor crystal are filled with gallium and arsenic atoms and the other is a semiconductor crystal in which the nodes are filled with gallium, aluminum, and arsenic atoms. These two regions abut each other to form a junction.

The foregoing example is only one of many possible implementations of a transistor, or electrical valve, that allows passage of current therethrough unless some step is taken to stop the flow of current. Such devices differ from those in which no current passes through the device unless some step is taken to permit such current flow. The circuits described herein are agnostic to the particular reasons for why a device is in a normally-conducting state and are therefore applicable to all such devices regardless of the underlying physics that causes the device to behave as it does.

In a power converter, it is useful for the switches within the charge pump 12 itself to be implemented with transistors that offer high-mobility charge carriers to achieve high power efficiency. However, the additional circuitry for controlling the charge pump 12 does not benefit so greatly from this advantage. Hence, the additional cost of such switches is difficult to justify. As such, given the constraints of present-day fabrication technology, it is useful to fabricate the second die 50 from a crystal in which the nodes are silicon atoms. In contrast to those on the first die 42, the transistors on the second die 50 are of the type that do not support a conducting path between their respective sources and drains in the absence of a voltage applied to corresponding gates thereof.

The controller 48 causes the switches 18-32 to open and close in such a way as to cause different configurations of the first and second pump capacitors 14, 16. In general, the controller 48 does not communicate directly with a switch 18-32. To open or close a switch 18-32, the controller 48 sends a control signal to a driving circuit 44. It is this driving circuit 44 that ultimately causes charge to flow into or out of a driven transistor's gate region so as to open or close the switch 18-32.

Figure 2:
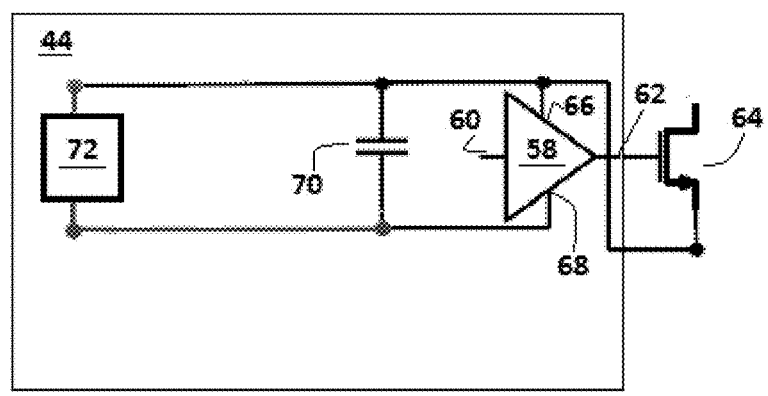
FIG. 2 shows details of a driver for driving a switch from the power converter shown in FIG. 1.

FIG. 2 shows one gate driver 58 for driving one transistor 64, which will hereafter be referred to as the "driven transistor" 64. The drive circuit 44 has as many of these gate drivers 58 as there are driven transistors 64.

The gate driver 58 includes a control input 60 and gate-drive output 62. The control input 60 connects to the controller 48 and receives a control signal therefrom. The gate-drive output 62 connects to a gate terminal of a driven transistor 64 that implements a switch 18-32. In response to a control signal at its control input 60, the gate driver 58 causes charge to flow towards or away from the gate terminal of the driven transistor 64 so as to cause the driven transistor 64 to transition between a conducting state and a non-conducting state.

This charge has to come from somewhere. To supply it, the gate driver 58 features first and second power terminals 66, 68. A potential difference between the first and second power terminals 66, 68 provides an electromotive force that can be used to place excess charge, and hence voltage, at the driven transistor's gate terminal.

To cause such a potential difference to exist, it is useful to connect one of the two power terminals 66, 68 to the source of the driven transistor 64 and the other of the two power terminals 68, 66 to a voltage that is fixed at some offset relative to the source voltage.

In those cases in which the driven transistor 64 is one that requires that a voltage be applied to its gate in order to halt conduction between its source and drain, the driven transistor's source terminal connects to the first power terminal 66. This is the configuration shown in FIG. 2. In all other cases, the driven transistor's source terminal connects to the second power terminal 68.

A constant voltage difference between the first and second power terminals 66, 68 arises from a bias capacitor 70 that has its anode connected to the first power terminal 66 and its cathode connected to the second power terminal 68. The voltage across the bias capacitor 70 is therefore an offset that maintains a constant potential difference between the first and second power terminals 66, 68. This means that regulating the voltage across the bias capacitor 70 amounts to regulating the potential difference between the first and second power terminals 66, 68.

In normal operation, the driven transistor's source voltage transitions between different values relative to ground. As a result, the voltage at the first power terminal 66, which after all is connected to the driven transistor's source, also transitions between different values relative to ground. Because the bias capacitor 70 maintains the second power terminal 68 at a fixed offset relative to the first power terminal 66, the voltage at the second power terminal 68 likewise varies relative to ground. However, the voltage difference between the first and second power terminals 66, 68 remains clamped at the same value by the voltage across the bias capacitor 70.

For the grounded switches 18, 20, no further circuitry is needed. After all, the source terminal of a grounded switch 18, 20 is grounded. Therefore, the grounded switch 18, 20 cannot help but have a constant source voltage. As a result, to cause a grounded switch 18, 20 to stop conducting, all that is necessary is to connect the bias capacitor's cathode to a negative supply voltage. The magnitude of this negative supply voltage is set to the desired offset between gate and source voltages for halting conduction of the driven transistor 64. The anode of the bias capacitor 70 connects to ground, along with the driven transistor's source terminal.

For the floating switches 22-32, the drive circuit 44 relies on a voltage governor 72 to accommodate variations in the driven transistor's source voltage. The various driving circuits 44 described herein differ primarily in the details of the voltage governor 72.

Figure 3:
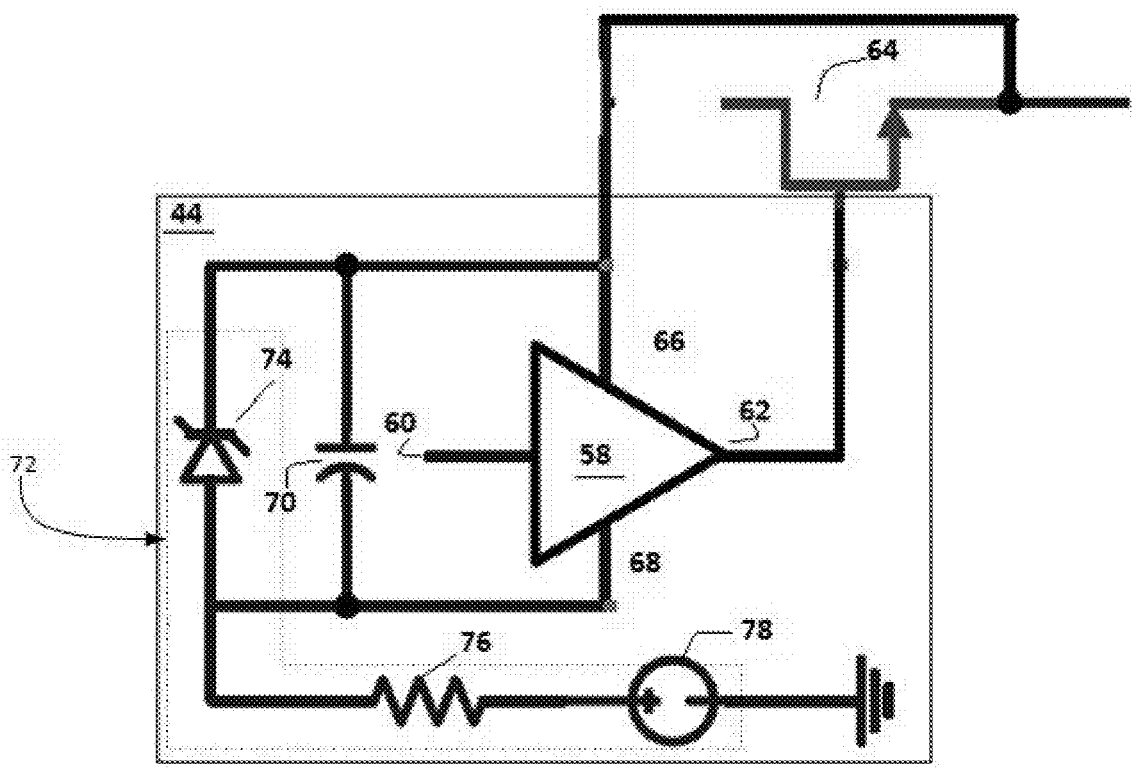
FIG. 3 shows a driver that relies on a Zener diode that is used in connection with preventing conduction through a normally-conducting transistor from FIG. 1.

FIG. 3 shows a drive circuit 44 in which the voltage governor 72 relies on a stable DC voltage source having a low series impedance. In the particular implantation shown, a Zener diode 74 functions as the required DC voltage source.

The cathode of the bias capacitor 70 connects to a series resistor 76 that is in series with a voltage source 78 that maintains a negative voltage across its terminals. As such, the voltage at the biasing capacitor's cathode is this negative voltage offset by the voltage drop associated with the series resistor 76.

With only the components identified thus far, the voltage across the bias capacitor 70 would tend to vary with time. This is undesirable because, when the driven transistor 64 should be off, a fixed offset is required between the gate and source voltages at the driven transistor 64.

To ensure such a fixed offset, it is useful to connect the Zener diode 74 across the bias capacitor 70 and to do so in such a way that the Zener diode 74 operates in breakdown mode. This ensures that the voltage across the bias capacitor 70 remains pegged to the breakdown voltage of the Zener diode 74. The series resistor 76 and voltage source 78 ensure that a DC path is available for the Zener diode's current to flow.

As a result, in operation, when the controller 48 provides a control signal to the control input 60 to close the switch, the gate voltage will be equal to the source voltage. This is because the source terminal of the driven transistor 64 has been shorted to the first power terminal 66 of the gate driver 58. This results in no voltage difference between the driven transistor's gate and source. In this configuration, the driven transistor 64 conducts.

When the controller 48 sends a signal to the gate driver's control input 60 to open the switch, the gate voltage will be at a fixed offset from the source voltage as a result of having been clamped by the Zener diode 74. The resulting voltage difference between the gate and source of the transistor prevents the driven transistor 64 from conducting.

Although the particular embodiment shown relies on a Zener diode 74, it is possible to replace the Zener diode 74 with any stable DC voltage source having a low series impedance.

Figure 4:
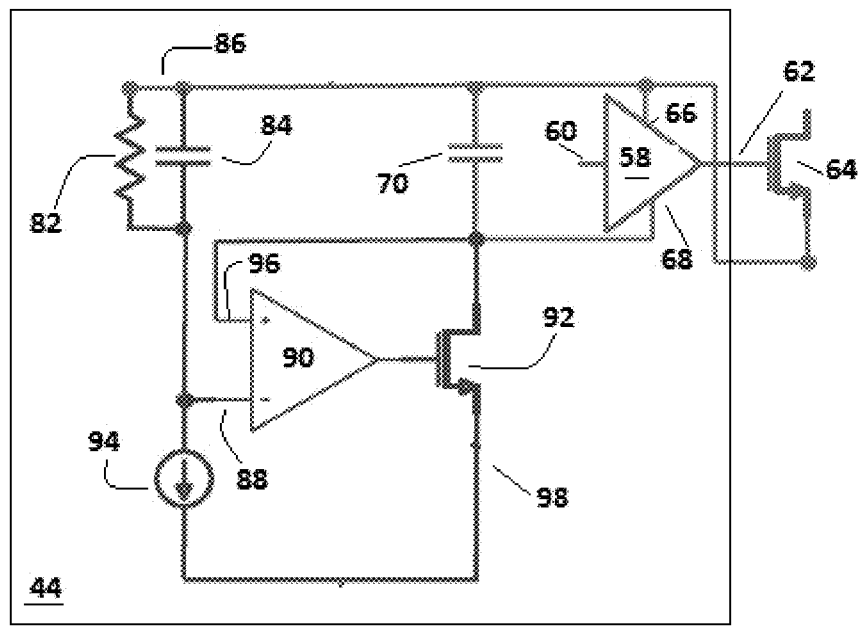
FIG. 4 shows a driver that relies on a shunt regulator to prevent conduction through a normally-conducting transistor from FIG. 1 from conducting.

In an alternative drive circuit 44, shown in FIG. 4, the governor 72 relies on a shunt regulator. This embodiment includes an RC resistor 82 and an RC capacitor 84 that is in parallel with this RC resistor 82. Together, they define an RC circuit 86 that connects between the first power terminal 66 and an inverting input 88 of a differential amplifier 90. The voltage presented to the inverting input 88 is therefore equal to the voltage at the first power terminal 66 but diminished by a voltage drop across the RC resistor 82 that is caused by current drawn by a current source 94.

Meanwhile, the non-inverting input 88 of the differential amplifier 90 connects to second power terminal 68.

As a result, the differential amplifier 90 sees a voltage difference that is controlled by the RC resistor 82 and the current flowing through a current source 94. This voltage difference provides a basis for the differential amplifier 90 to carry out feedback control of the voltage across the bias capacitor 70.

The differential amplifier 90 has an output that connects to a gate of a shunt device 92, which in this embodiment is implemented as an enhancement-mode field-effect transistor. The shunt device 92 connects to the cathode of the bias capacitor 70 so that when the shunt device 92 is made to conduct, it discharges the bias capacitor 70.

When the differential amplifier 90 causes the shunt device 92 to conduct, charge flows out of the bias capacitor 70, thus reducing the voltage across the bias capacitor 70. This provides a way to regulate the voltage across the bias capacitor 70. As a result, the current source 94 and the shunt device 92 cooperate to form a voltage-controlled current source. The current through this voltage-controlled current source depends on a voltage provided by the differential amplifier's output.

The differential amplifier's inverting input 88 also connects to this current source 94. A voltage drop defined by the product of the current provided by the current source 94 and the resistance of the RC resistor 82 sets the desired voltage difference across the bias capacitor 70. This will ultimately set the voltage difference between the gate and source when driven transistor 64 is non-conducting.

Meanwhile, a non-inverting input 96 of the differential amplifier 90 connects to the cathode of the bias capacitor 70.

In operation, it can be seen that the differential amplifier adjusts the gate voltage of the shunt device 92 in an effort to ensure that the voltage difference between the inverting and non-inverting inputs 88, 96 is zero. This amounts to ensuring that the voltage across the bias capacitor 70 is equal to the voltage drop across the RC resistor 82 as a result of the current drawn by the current source 94.

As long as the voltage difference between the inverting and non-inverting inputs 88, 96 is zero, the shunt device 92 remains open. As a result, the voltage across the bias capacitor 70, which is already at the correct value, does not change. In all other cases, the differential amplifier 90 closes the shunt device 92 so as to allow the charge stored in the voltage across the bias capacitor 70 to change in a way that restores the voltage difference between the inverting and non-inverting inputs 88, 96 to zero. Once this occurs, balance has been restored and the differential amplifier 90 again opens the shunt device 92.

The bias capacitor 70 provides the charge to turn off the driven transistor 64. It also provides the charge needed to support any supply and bias currents required to operate the gate driver 58. In the course of providing this charge, the bias capacitor 70 will naturally discharge itself. The charge that the bias capacitor 70 inevitably loses during these operations must therefore be replenished. The differential amplifier 90, the shunt device 92, the current source 94, the RC resistor 82, and the RC capacitor 84 all cooperate to define a shunt regulator that replenishes the charge that the bias capacitor 70 loses as it carries out its functions.

By properly selecting the value of the voltage drop across the RC resistor 82, it becomes possible to establish a set point for the voltage difference across the bias capacitor 70. This ensures that when the driven transistor 64 is to be opened, the gate voltage differs from the source voltage by the required amount.

The differential amplifier 90 and the shunt device 92 define a shunt regulator 98.

In those cases where the charge pump 12 has a 50% duty cycle for recharging the bias capacitor 70, it is possible for the shunt regulator 98 to have a relatively low bandwidth. This promotes stability of the feedback loop. In some cases, it is possible to dispense with the feedback loop altogether.

The components other than the driven transistor 64 and the bias capacitor 70 are integrated into the second die 50. In embodiments that use high-density capacitors, there exists the possibility of also integrating the bias capacitor 70. In some embodiments, additional internal capacitors maintain a stable supply voltage during transient events.

Figure 5:
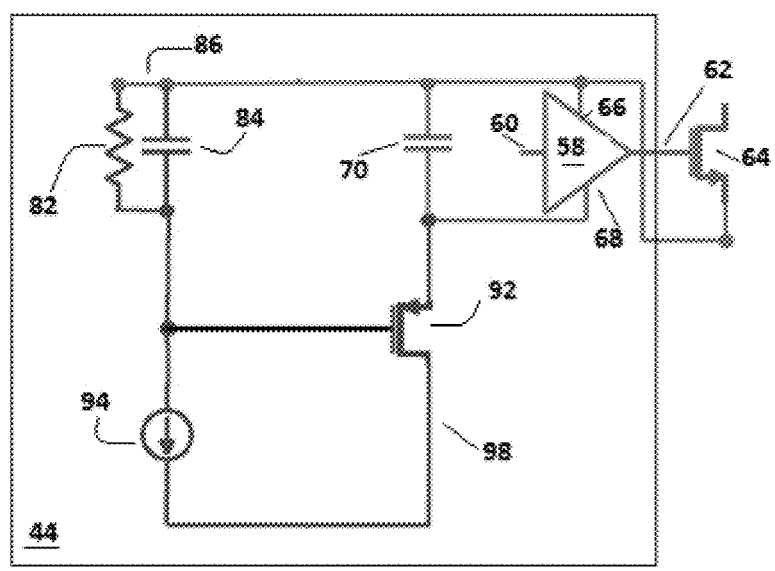
FIG. 5 shows a driver that relies on a source follower to prevent conduction through a normally conducting transistor from FIG. 1 from conducting.

FIG. 5 shows a drive circuit 44 in which the governor 72 relies on a source follower.

The first power terminal 66 of the gate driver 58 connects to both the anode of a bias capacitor 70 and to the driven transistor's source. The second power terminal 68 connects to the cathode of the bias capacitor 70 and to a shunt device 92 that operates as a source follower.

The drive circuit 44 further includes a parallel RC circuit 86 that connects between the first power terminal 66 of the gate driver 58 and the gate of the shunt device 92. The parallel RC circuit 86 includes an RC resistor 82 that is in parallel with an RC capacitor 84. The gate of the shunt device 92 also connects to a current source 94. The voltage drop defined by the product of the current source's current and the resistance of the RC resistor 82 sets the desired voltage difference across the bias capacitor 70.

The RC circuit 86 and the anode of the bias capacitor 70 are both connected to the same voltage. In this configuration, the sum of the voltage drop across the RC resistor 82 and that between the shunt switch's gate and source will equal the desired voltage drop across the bias capacitor 70. If the source voltage of the driven transistor 64 changes, then the voltage presented to the gate terminal of the shunt device 92 and the voltage presented to the source terminal of the shunt device 92 will deviate. As a result, the current through the shunt device 92 will change. This will allow the amount of charge on the bias capacitor 70 to change, thus changing the voltage difference across the bias capacitor 70 until it once again matches that across the resistor 82. At that point, the gate and source voltages presented to the shunt device 92 will once again reach a steady-state condition.

By properly selecting the value of the voltage drop across the RC resistor 82, it becomes possible to establish a set point for the voltage difference across the bias capacitor 70. This ensures that when the driven transistor 64 is to be opened, the gate voltage differs from the source voltage by the required amount.

A source-following drive circuit 44 as shown in FIG. 5 is particularly useful for an N:1 converter in which intermediate voltages from the charge pump 12 create a lower bias voltage at the shunt device 98, thereby promoting the creation of a negative bias voltage at the cathode of the bias capacitor 70 with respond to its anode. This, in turn, creates a negative bias voltage to cause the driven transistor 64 to stop conducting. The current source 94 and the RC resistor 82 cooperate to generate a bias voltage relative to an appropriate one of the intermediate voltages in the charge pump 12.

In the source-following drive circuit 44 as shown in FIG. 5, components other than the driven transistor 64 and the bias capacitor 70 are integrated into the second die 50. In embodiments that use high-density capacitors, there exists the possibility of also integrating the bias capacitor 70. In some embodiments, additional internal capacitors maintain a stable supply voltage during transient events.

Figure 6:
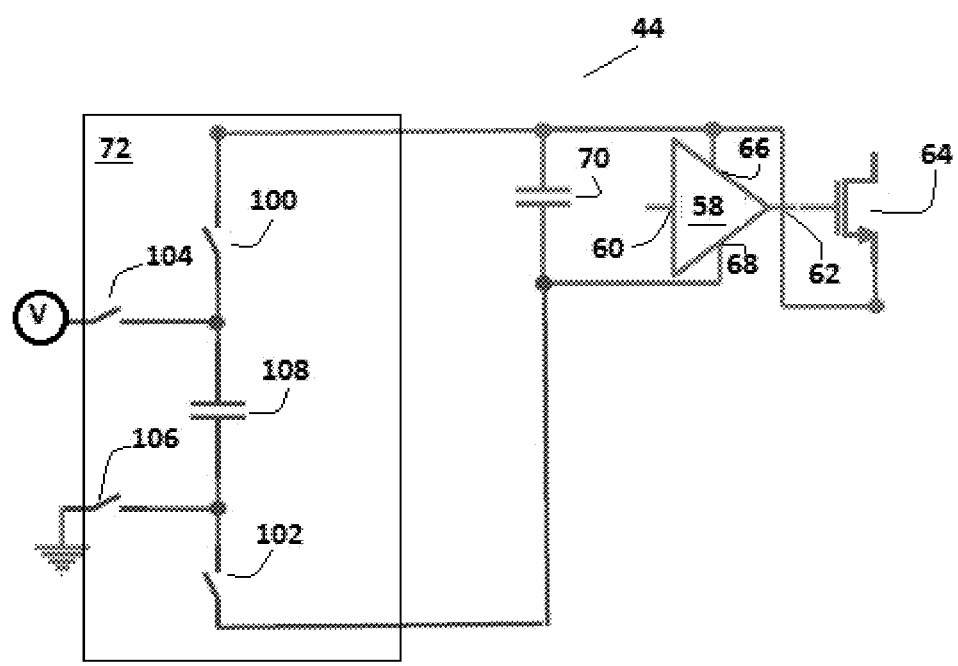
FIG. 6 shows an alternative driver that relies on a switched capacitor to prevent conduction through a normally-conducting transistor from FIG. 1 from conducting.

FIG. 6 shows an alternative drive circuit 44 in which first, second, third, and fourth switches 100, 102, 104, 106 cause a first storage capacitor 108 to alternate between collecting more charge and dispensing charge as needed to the bias capacitor 70.

Closing the first switch 100 connects the first storage capacitor 108 to the driven transistor's source, to the first power terminal 66, and to the anode of the bias capacitor 70. Closing the second switch 102 connects the first storage capacitor 108 to the second power terminal 68 and to the cathode of the bias capacitor 70. Closing the third switch 104 connects the first storage capacitor 108 to a voltage source. Closing the fourth switch 108 grounds the first storage capacitor 106.

While the driven transistor 64 conducts, the controller 48 closes the third and fourth switches 104, 106 to replenish the first storage capacitor 108. This will ensure that the storage capacitor 108 will be ready with adequate charge when it is called into action to put an end to conduction.

At the charge replenishment stage, the controller 48 opens the third and fourth switches 104, 106 and then closes the first and second switches 100, 102. This allows the first storage capacitor 108 to replenish the charge on the bias capacitor 70 thus ensuring that the voltage across the bias capacitor 70 is adequate to drive the driven transistor 64 into a non-conducting state and to hold it there.

In the embodiment shown in FIG. 6, it may be necessary for the third and fourth switches 104, 106 to be robust enough to sustain a high voltage. An alternative switched-capacitor based drive circuit 44 shown in FIG. 7 obviates this difficulty by harvesting a supply voltage from one of the intermediate voltages available within the charge pump 12. This comes at the cost of an additional capacitor.

Figure 7:
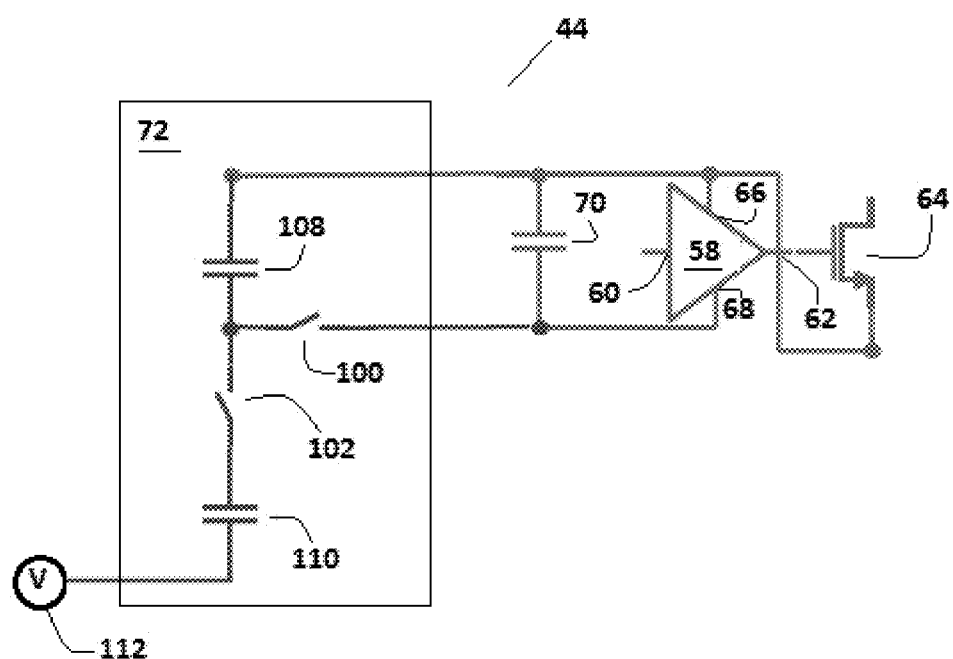
FIG. 7 shows an alternative driver that relies on a pair of switched capacitors to prevent conduction through a normally-conducting transistor from FIG. 1.

In FIG. 7, an alternative drive circuit 44 that also relies on a switched-capacitor circuit includes a gate driver 58 having a control input 60, a gate-drive output 62, a first power terminal 66, and a second power terminal 68. The control input 60 connects to the controller 16 to receive a control signal to control a driven transistor 64. The gate-drive output 62 connects to the gate of the driven transistor 64.

The first power terminal 66 of the gate driver 58 connects to both the anode of a bias capacitor 70 and to the driven transistor's source. The second power terminal 68 connects to the cathode of the bias capacitor 70.

The drive circuit 44 also includes first and second switches 100, 102 that interconnect the bias capacitor 70 and first and second storage capacitors 108, 110 to form a switched-capacitor network. The first and second storage capacitors 108, 110 function as a voltage divider so that the voltage across the bias capacitor 70 ultimately depends on the ratio between the capacitances of the first and second storage capacitors 108, 110.

When closed, the first switch 100 creates a parallel connection between the first storage capacitor 108 and the bias capacitor 70. When closed, the second switch 102 connects the first and second storage capacitors 108, 110 in series. The second storage capacitor 110 connects to an intermediate voltage derived from another location within the charge pump 112.

In operation, when the driven transistor 64 is conducting, the first switch 100 is open and the second switch 102 is closed. As a result, the second storage capacitor 108 replenishes its charge using the intermediate voltage source.

When it is time to replenish the charge on the bias capacitor 70, the second switch opens 102, after which the first switch 100 closes. With the first storage capacitors 106 and the bias capacitor 70 now in parallel, the second storage capacitor 108 is able to replenish the charge on the bias capacitor 70, thus raising the voltage across it to the offset required to cause the driven transistor 64 to cease conduction.

In this configuration, the first and second switches 100, 102 can be relatively low voltage switches because they will connect to the lower intermediate voltages within the charge pump 12 rather than to a possibly much higher external supply voltage.

Having described the invention, and a preferred embodiment thereof, what is claimed as new and secured by Letters Patent is:

1. An apparatus comprising a power converter comprising a charge pump that comprises a switching network to interconnect pump capacitors, wherein said switching network comprises transistors and a controller, wherein said controller is to cause said transistors to transition between conducting and non-conducting states thereby causing said pump capacitors to be interconnected in different arrangements, wherein said transistors comprise a first transistor that is to transition into a conducting state when a source and gate of said first transistor are at equal potentials, said switching network further comprising a gate driver connected to a gate of said first transistor, wherein a source of said first transistor is connected to said gate driver.

2. The apparatus of claim 1, wherein, during operation of said charge pump, a source potential of said first transistor varies with time.

3. The apparatus of claim 1, wherein, to cause said first transistor to cease conducting, said gate driver applies, to said gate, a voltage that varies with said different arrangements of said power converter and that remains constant during a particular arrangement of said power converter.

4. The apparatus of claim 1, further comprising a driver to drive said first transistor, said driver comprising a voltage governor to cause an output voltage of said driver to vary in response to variations in a source voltage of said first transistor.

5. The apparatus of claim 1, further comprising first and second dies, wherein said first die comprises said first transistor, wherein said second die comprises a first drive circuit to drive said first transistor, wherein a communication link exists between said first and second dies, and wherein said first and second dies are made from different semiconductors.

6. The apparatus of claim 1, further comprising a first die that is formed from a substrate other than silicon and a second die that is formed from a silicon substrate, wherein said first die comprises said first transistor, wherein said second die comprises a first drive circuit to drive said first transistor, and wherein a communication link exists between said first and second dies.

7. The apparatus of claim 1, further comprising a driver for driving said first transistor, said driver comprising a Zener diode connected in parallel with a bias capacitor, the voltage across which controls an offset between said first transistor's gate and source voltages when said first transistor is made to cease conduction, and wherein said Zener diode connects between said first transistor's source and a voltage source.

8. The apparatus of claim 1, further comprising a driver for driving said first transistor, wherein said driver comprises a bias capacitor to connect to a switch that is to close when a voltage across said bias capacitor is in excess of a desired offset between said drain and source of said first transistor.

9. The apparatus of claim 1, further comprising a driver for driving said first transistor, wherein said driver comprises a bias capacitor, a differential amplifier, and a switch, wherein said bias capacitor is connected to said switch, wherein said differential amplifier is to provide a control signal to open and close said switch, wherein said differential amplifier comprises first and second inputs to define a voltage difference that varies in response to variations in voltage across said bias capacitor, and wherein a voltage across said bias capacitor is to control an offset between said first transistor's gate and source voltages when said first transistor is made to cease conduction.

10. The apparatus of claim 1, further comprising a driver to drive said first transistor, wherein said driver comprises a bias capacitor and a switch connected to said bias capacitor, wherein said switch is to receive a signal to open and close in response to variations in a source voltage of said first transistor, and wherein a voltage across said bias capacitor is to control a difference between a gate voltage and a source voltage of said first transistor.

11. The apparatus of claim 1, further comprising a driver to drive said first transistor, wherein said driver comprises a switched-capacitor circuit comprising first and second switches and first and second capacitors, wherein a voltage across said first capacitor is to govern a voltage difference between a source and gate of said first transistor, wherein said second capacitor is to replenish charge on said first capacitor as needed to maintain a desired voltage, and wherein said switches are to connect and disconnect said first and second capacitors from each other.

12. The apparatus of claim 1, further comprising a driver to drive said first transistor, wherein said driver comprises a switched-capacitor circuit that comprises first and second switches and first and second capacitors, wherein a voltage across said first capacitor is to govern a voltage difference between a source and gate of said first transistor, wherein said second capacitor is to replenish charge on said first capacitor as needed to maintain a desired voltage, and wherein said switches are to connect and disconnect said first and second capacitors from each other and to connect and disconnect said second capacitor from an external voltage source.

13. The apparatus of claim 1, wherein said charge pump comprises an internal node that is at an intermediate voltage, wherein said apparatus further comprises a driver that comprises a switched-capacitor circuit, wherein said switched-capacitor circuit comprises a first capacitor and a second capacitor, wherein a voltage across said first capacitor is to govern a voltage difference between a source and gate of said first transistor, and wherein said second capacitor is to connect to said node to obtain charge for use in replenishing said first capacitor as needed to maintain a desired voltage across said first capacitor.

14. The apparatus of claim 1, wherein said charge pump comprises an internal node that is at an intermediate voltage, wherein said apparatus further comprises a driver that comprises a switched-capacitor circuit, wherein said switched-capacitor circuit comprises first, second, and third capacitors, wherein a voltage across said first capacitor is to govern a voltage difference between a source and gate of said first transistor, wherein said second capacitor is to connect to said node to obtain charge for use in replenishing said first capacitor as needed to maintain a desired voltage across said third capacitor, and wherein said third capacitor is to replenish charge on said first capacitor.

15. The apparatus of claim 1, further comprising an inductance to connect to said charge pump to recover at least some energy that would otherwise have been lost during redistribution of charge between said pump capacitors and to subsequently release said recovered energy back to said charge pump.

16. The apparatus of claim 1, wherein said different arrangements are to interconnect said pump capacitors so as to form at least two charge-transfer paths that exist at different times during operation of said switching network.

17. The apparatus of claim 1, further comprising a die, wherein said die comprises said first transistor and a first drive circuit to drive said first transistor.

18. The apparatus of claim 1, further comprising a first die and a second die, wherein said transistors of said switching network are on said first die and said controller, said gate driver, additional gate drivers, and level shifters to operate said transistors are on said second die.

19. The apparatus of claim 1, wherein said switching network comprises transistors that are disposed to selectively ground cathodes of said pump capacitors and transistors that are disposed to interconnect anodes of said pump capacitors.

* * * * *